(12) United States Patent
Kono

(10) Patent No.: US 9,000,465 B2
(45) Date of Patent: Apr. 7, 2015

(54) LIGHT EMITTING DEVICE

(75) Inventor: Hiroshi Kono, Anan (JP)

(73) Assignee: Nichia Corporation, Anan-Shi, Tokushima (JP)

( * ) Notice: Subject to any disclaimer, the term of this patent is extended or adjusted under 35 U.S.C. 154(b) by 0 days.

(21) Appl. No.: 13/601,230

(22) Filed: Aug. 31, 2012

(65) Prior Publication Data

US 2013/0056780 A1 Mar. 7, 2013

(30) Foreign Application Priority Data

Sep. 2, 2011 (JP) ................................ 2011-191659

(51) Int. Cl.
*H01L 33/60* (2010.01)
*H01L 33/48* (2010.01)
*H01L 33/62* (2010.01)

(52) U.S. Cl.
CPC ............. *H01L 33/60* (2013.01); *H01L 33/486* (2013.01); *H01L 33/62* (2013.01); *H01L 2924/0002* (2013.01)

(58) Field of Classification Search
CPC ......... H01L 33/60; H01L 33/56; H01L 33/54; F21S 48/1317; F21S 48/145
USPC ...................... 257/98, E33.001–E31.077, 99; 362/517, 217.11, 632, 241
See application file for complete search history.

(56) References Cited

U.S. PATENT DOCUMENTS

| 7,422,338 B2 * | 9/2008 | Kono et al. ................. 362/27 |
| 2008/0048201 A1 | 2/2008 | Kim et al. | |
| 2010/0102345 A1 * | 4/2010 | Kong et al. .................. 257/98 |
| 2011/0001149 A1 * | 1/2011 | Chan et al. ................... 257/91 |
| 2011/0175127 A1 * | 7/2011 | Kanada et al. .............. 257/98 |

FOREIGN PATENT DOCUMENTS

| DE | 10 2008 016 529 A1 | 7/2009 |
| EP | 1 998 380 A2 | 3/2008 |
| EP | 2 315 263 A1 | 4/2011 |
| JP | 2000-012894 A | 1/2000 |
| JP | 2008-53726 A | 3/2008 |
| JP | 2009-176962 A | 8/2009 |
| JP | 2010-34295 A | 2/2010 |
| JP | 2010-141058 A | 6/2010 |
| WO | 2008/023875 A1 | 2/2008 |

OTHER PUBLICATIONS

European Search Report dated May 20, 2014, for corresponding European Application No. 12182623.4.

* cited by examiner

*Primary Examiner* — Tom Thomas
*Assistant Examiner* — John Bodnar
(74) *Attorney, Agent, or Firm* — Squire Patton Boggs (US) LLP

(57) ABSTRACT

A light emitting device, comprising: a package which is formed of a resin and has a recess which is provided with a bottom face and two pairs of opposite inner walls surrounding the bottom face, the package having two pairs of opposite side walls made of the inner walls and corresponding outer walls; a lead frame exposed at the bottom face; a light emitting element which is provided on the lead frame; and a sealing resin provided in the recess for sealing the light emitting element, wherein the lead frame has a bottom plate portion and a reflector portion exposed along one of the pair of opposite inner walls, and a first angle between the reflector portion and the bottom face is greater than a second angle between another one of the pair of opposite inner walls which is opposite to the reflector portion and the bottom face, is provided.

20 Claims, 5 Drawing Sheets

LIGHT EMITTING DEVICE

CROSS REFERENCE TO RELATED APPLICATION

The present application claims benefit of the filing date of Japanese Patent Application No. 2011-191659 filed on Sep. 2, 2011, the disclosure of which is incorporated herein by reference.

BACKGROUND OF THE INVENTION

1. Field of the Invention

The present invention relates to a light emitting device which emits light by a light emitting element, and more particularly, to a light emitting device with high brightness and high output.

2. Description of the Related Art

In recent years, light emitting elements with high brightness and high output and compact light emitting devices have been developed and are used in various fields. Using features of compact size, low power consumption, and light weight, etc., such light emitting devices are used, for example, as light sources of backlights for liquid crystal displays, light sources for various kinds of meters, and various kinds of read-out sensors, etc.

As one example, a light source used for backlight is required to be thinner such that an equipment in which the backlight is used can be made more compact and lightweight. Accordingly, a light emitting device used as the light source is required to be compact, and to this end, various kinds of light emitting devices referred to as a side view type have been developed. In general, the side view type light emitting device has a configuration where a light emitting element is mounted in a package which is provided with a recess having a bottom face and an inner wall surrounding the bottom face and part of a lead frame is taken as an external terminal from an inside of the package to an outside thereof.

In order to downsize the side view type light emitting device, reduction in height (thickness) has mainly been developed. Also, as the light emitting device is downsized, the light emitting element comes extremely close to the inner wall, the package is discolored by light which is directly incident from the light emitting element on the package inner wall, and a lifetime of the light emitting device is shortened. In order to solve the above problem, for example, a technique for preventing discoloration of the package by bending a part of the lead frame along the package inner wall so that the light incident on the package inner wall is intercepted is well known (for example, see Patent Literatures 1 and 2).

PRIOR ART REFERENCE

Patent Literature

Patent Literature 1: JP 2008-053726 A
Patent Literature 2: JP 2010-034295 A

SUMMARY OF THE INVENTION

Although a conventional light emitting device achieves downsizing by providing part of the lead frame as reflectors on both side of opposite side walls while keeping high output, further downsizing is required while keeping high output.

In view of the above requirement, an object of the present invention is to provide a light emitting device which achieves high output and downsizing.

In order to achieve the above object, the present invention provides a light emitting device, comprising: a package which is formed of a resin and has a recess which is provided with a bottom face and two pairs of opposite inner walls surrounding the bottom face, the package having two pairs of opposite side walls made of the inner walls and corresponding outer walls; a lead frame exposed at the bottom face; a light emitting element which is provided on the lead frame; and a sealing resin provided in the recess for sealing the light emitting element, wherein the lead frame has a bottom plate portion and a reflector portion exposed along one of the pair of opposite inner walls, and a first angle between the reflector portion and the bottom face is greater than a second angle between another one of the pair of opposite inner walls which is opposite to the reflector portion and the bottom face.

According to the above structure, compared to a conventional configuration having reflector portions which are provided on opposite side faces respectively, the light emitting device of the present invention has the reflector portion which is provided on one of the opposite side walls. Accordingly, the side wall of another side face having no reflector portion can be made thinner, and the package can be made thinner. Also, compared to the conventional configuration having reflector portions which are provided on opposite side faces respectively, the light emitting device of the present invention has high output. That is, the light emitting device achieves high output by changing an angle between the reflector portion of one of the opposite side faces and the another side face. In other words, in the light emitting device of the present invention, when light is emitted from the light emitting element in the recess in a direction to be emitted, the light is reflected by the reflector portion and is emitted through an opening of the recess, the light is incident on the side face of the package made of resin and is emitted through the opening of the recess in the direction to be emitted, or the light is incident on the reflector portion and is reflected by the reflector portion to be emitted in the direction to be emitted. Accordingly, the light emitting element can emit light efficiently through the opening of the recess, and high output can be achieved.

Also, in the light emitting device, a thickness of the resin of the package from an inner wall to its corresponding outer wall is such that one of the pair of the side walls is greater than the another one of the pair of the side walls.

According to the above structure, in the light emitting device, a resin can be appropriately filled in the side wall on which the reflector portion is formed. Also, compared to the conventional configuration having reflector portions which are provided on opposite side faces respectively, the package can be made smaller (thinner). In addition, in the light emitting device, if a projecting portion is provided on the side wall on which the reflector portion is not provided so that the side wall is made to be thin as a mounting face, for example, since the thin side wall does not contact other components at the time when the light emitting device is incorporated into a product, and a strength of the package is improved.

Further, the light emitting element is placed at a position closer to the reflector portion than to a center of the bottom face between the pair of the opposite side walls.

According to the above structure, a distance from light emitting element to the side face which is made of the resin of the package can be made long, and deterioration of the resin can be prevented.

Also, in the light emitting device, a plurality of the light emitting elements are placed separated apart from each other in a longitudinal direction of the bottom face.

According to the above structure, since the plurality of the light emitting element emit light, the light emitting device has high output.

Also, in the light emitting device, a plurality of reflector portions are placed spaced apart from each other corresponding to the light emitting elements, and the inner wall of the resin of the package is exposed between adjacent ones of the plurality of reflector portions.

According to the above structure, for example, if two light emitting elements are provided in the light emitting device, the reflector portion can reflect the light from the light emitting element efficiently since the reflector portions are placed at intervals corresponding to the light emitting elements.

Further, in the light emitting device, the bottom plate portion of the lead frame has a cut-off portion exposing a part of the bottom face of the resin of the package at corresponding positions between adjacent ones of the plurality of the reflector portions. Also, in the light emitting device, a bottom plate portion of the lead frame has a groove separating the bottom plate portion of the lead frame at corresponding positions between adjacent ones of the plurality of reflector portions.

According to the above structure, in the light emitting device, the cut-off portion or the notch is formed on the bottom plate of the lead frame, the cut-off portion or the notch is embedded in the resin of the package, and the adherence between the lead frame and the resin is increased. Also, the more the exposure of the resin of the package, the better the connection between the package and the sealing resin.

Also, in the light emitting device, the lead frame has a projecting portion which is extended outwardly from the package through the another of the pair of the side walls and is bent along corresponding outer wall of the package.

According to the above structure, in the light emitting device, the projecting portion is connected to a substrate, the reflector portion is provided at opposite side of the substrate, and light is emitted in a direction to be emitted appropriately.

Also, in the light emitting device, the recess of the package has an opening wider in the longitudinal direction, the package has a width at a central position in the longitudinal direction of the opening greater than a width at both sides of the central position, the light emitting element is placed on the lead frame at a position corresponding to the central portion, and the projecting portions formed along the outer wall at both sides of the central position.

According to the above structure, in the light emitting device, since the projecting portions are provided at the positions adjacent to the central position of the package, and the projecting portion does not project over a bulging portion at the central position of the package. Also, if the thickness of the light emitting device is made to be thinner as a whole, the bottom face which functions as a mounting face for the light emitting element can be kept.

Also, in the light emitting device, the projecting portion has two terminal portions respectively bent along the outer walls of the package, and two bent portions adjacent to respective terminal portions and respectively bent along the outer wall of the package.

According to the above structure, the light emitting device is placed while the terminal is connected to the substrate, the bent portion is exposed on the bottom face of the package, and the exposed bent portion functions as a heat radiator. Also, the bent portion can function as a terminal when it is electrically connected to the substrate.

Further, in the light emitting device, the bent portions are connected by a back face bent portion formed along a back face of the package at respective end portions.

According to the above structure, the light emitting device can radiate more heat generated by the lead frame into the air using the back face bent portion.

The light emitting device according to the present invention can achieve the following effects.

In the light emitting device, since the reflector portion is formed by bending the lead frame, the reflector portion is provided along one side face of the opposite side faces, and the inclined angle of the reflector portion is greater than an inclined angle of another side face of the opposite side faces, the light from the light emitting element can be reflected in the direction to be emitted appropriately so as to achieve high output. Also, in the light emitting device, since the reflector portion is provided at one side face of the opposite side faces and is not provided at another side face, the side wall having no reflector portion can be made thinner, and the package can be made thinner compared to the conventional configuration having reflectors which are provided on opposite side faces respectively.

Since one side wall having the reflector portion is thicker than another side wall, the light emitting device can be made thinner while keeping high output, and, for example, can be used for a thin backlight of a liquid crystal display.

In the light emitting device, since the light emitting element is placed at a position shifted toward the reflector portion, a distance from the light emitting element to the side face on which the resin of the package is exposed can be made long, and discoloration of the resin can be prevented.

In the light emitting device, since a plurality of the light emitting elements are provided and the reflector portion are formed corresponding to the light emitting elements, downsizing and high output of the light emitting device can be achieved.

In the light emitting device, since the inner wall of the resin is exposed between the reflector portions and the cut-off portion or the notch is formed at the lead frame, a contact area between the sealing resin and the resin of the package is increased, and the sealing resin is connected more firmly.

Since the lead frame passes through the package, is bent along the outer wall, and is bent along the outer walls adjacent to the central position having large thickness, the light emitting device can be downsized.

Since the projecting portion has two terminals which are formed along the outer wall of the package and two bent portions which are adjacent to the terminals and are formed along the outer wall of the package, the light emitting device is downsized and radiates heat efficiently. Also, by providing the back face bent portion, the light emitting device can radiate heat generated by the lead frame and deterioration caused by heat can be prevented.

DETAILED DESCRIPTION OF THE PREFERRED EMBODIMENTS

Figure 1:
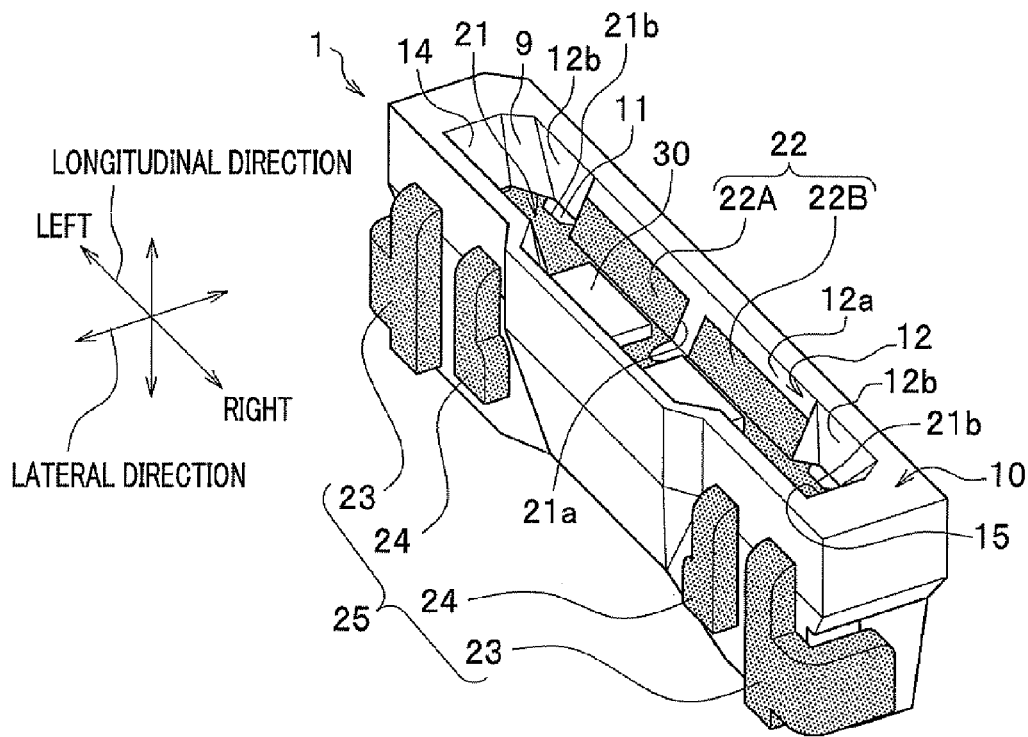
FIG. 1 is a perspective view showing a light emitting device according to the present invention.

Hereinafter, with reference to FIGS. 1-8, embodiments of the present invention will be explained. In addition, sizes and positional relationships, etc. of components shown in each of FIGS. 1-8 may be exaggerated in order to clarify explanation. Further, in the explanation described below, components having the same function or feature are denoted by the same reference numbers, and the repetitive description thereof will be omitted. Also, when an opening of a recess 9 of a light emitting device 1 is referred to as a front face, a face opposite to the opening is referred to as a rear face (back face) 19, a face connected to a substrate 50 via a projecting portion 25 is referred to as an outer bottom face 16, and a face opposite to the outer bottom face 16 is referred to as a top face with reference to the front face.

As shown in FIG. 1, the light emitting device 1 has a package 10 which is provided with the recess 9 on a front face thereof, a lead frame 20 exposed on a bottom face 11 of the recess 9, and a light emitting element 30 mounted on the lead frame 20. In addition, the recess 9 of the light emitting device 1 is filled with a sealing resin 40 (see FIG. 2A) through which light passes so as to be sealed with the sealing resin 40.

Figure 3:
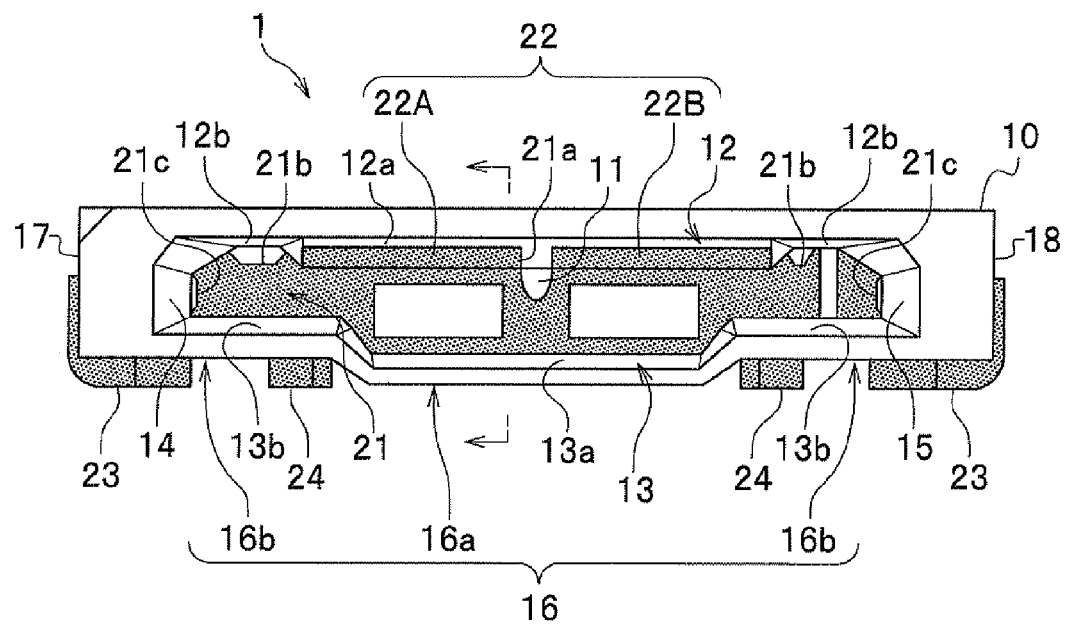
FIG. 3 is a front view of the light emitting device according to the present invention.

The lead frame 20 is provided in the package 10, and is electrically connected to the light emitting element 30. In addition, as shown in FIG. 3, the lead frame 20 is separated (an anode and a cathode) by one or more bottom plate portion 21 on which the light emitting element 30 is mounted, and is electrically connected to the light emitting element 30 via a wire (not shown), etc. The lead frame 20 is a substantially metallic plate, and may be corrugated or rough. The thickness of the lead frame 20 may be even or uneven. In addition, the lead frame 20 means one or both of two lead frames in the following description.

Although a material of the lead frame 20 is not limited, a material having relatively high thermal conductivity is more preferable. Since the lead frame 20 is made of such materials, heat generated by the light emitting element 30 can be transmitted to a below described projecting portion 25 efficiently. For example, the material of the lead frame 20 preferably has following characteristics: i.e., 200 W/(m·K) or more thermal conductivity, relatively large mechanical strength, and easy processing in blanking or etching, etc. Particularly, metals such as copper, aluminum, gold, silver, tungsten, iron, and nickel, etc. or alloys such as iron-nickel alloy, and phosphor bronze, etc. can be listed. Also, the surface of the lead frame 20 is preferably reflective plated in order to extract light from the light emitting element 30 efficiently.

As shown in FIG. 1, the lead frame 20 is provided with the bottom plate portion 21 formed along the bottom face 11 of the recess 9 of the package 10; a reflector 22 formed by bending one end of the bottom plate portion 21 in a vertical direction along a side face 12 which constitutes the recess 9 of the package 10; a projecting portion 25 formed by other end of the bottom plate portion 21 passing through the side face 13 of the package 10 from the bottom face 11 in the lateral direction. In addition, as the projecting portion 25, the lead frame 20 has a terminal 23 and a bent portion 24 formed by bending the other end of the bottom plate portion 21 along an outer wall of the package 10 at an inner position of the terminal 23 in a longitudinal direction. Also, as shown in FIG. 3, one terminal 23 and one bent portion 24 are integrally formed with the lead frame 20, and another terminal 23 is integrally formed with the lead frame 20.

As shown in FIG. 3, the bottom plate portion 21 of the lead frame 20 is formed along the bottom face 11 of the recess 9 of the package 10. Also, the bottom plate portion 21 has a cut-off portion 21a formed at a position between reflectors 22 (a first reflector 22A and a second reflector 22B) corresponding to a position between the light emitting elements 30. Further, the bottom plate portion 21 has cut-off portions 21b formed at both ends of the side face 12 of the recess 9, and cut-off portions 21c formed at a left side face 14 and a right side face 15 of the recess 9. By forming these cut-off portion 21a and cut-off portions 21b and 21c, a contact area between the bottom plate portion 21 and the sealing resin 40 is increased (see FIGS. 2A and 2B), and connection between the package 10 and the sealing resin 40 is improved. In addition, one cut off portion 21c is formed at a bottom plate of other lead frame 20.

As shown in FIGS. 1 and 3, the reflector 22 is bent at a predetermined angle with the bottom plate portion 21, and is formed so as to be co-planar with the side face 12 of the package 10. This reflector 22 has a height higher than that of the light emitting element 30. Also, when two light emitting element 30 are provided, the first reflector 22A and the second reflector 22B partitioned with the cut-off portion 21a are formed at positions corresponding to the light emitting elements 30 respectively. As shown in FIG. 3, widths of the first and second reflectors 22A and 22B are wider than widths of the light emitting element 30 respectively.

Further, in view of prevention of discoloration of the package 10, when the reflector 22 is bent at the predetermined angle, the reflector 22 is preferably provided at a position opposite to the light emitting element 30, and preferably has height and width larger than those of the light emitting element 30. In addition, since adherence between the reflector 22 of the lead frame 20 and the sealing resin 40 filled in the recess 9 is lower than that between the package 10 and the sealing resin 40, a peeling may occur at an interface between the reflector 22 and the sealing resin 40. Accordingly, a width of the reflector 22 exposed in the recess 9 is preferably equal to or more than a width of the light emitting element 30, a height of the reflector 22 exposed in the recess 9 is preferably equal to or more than a height of the light emitting element 30, and a resinous portion of the package 10 which is not covered with the reflector 22 is preferably exposed on an inner wall of the recess 9 as the cut-off portion 21a, etc. At this time, it is more preferable that the resinous portion of the package 10 is exposed around the top face of the opening of the recess 9. In this way, adherence between the sealing resin 40 and the inner wall of the recess 9 can be kept while exposure of the package 10 is prevented.

Figure 2A:
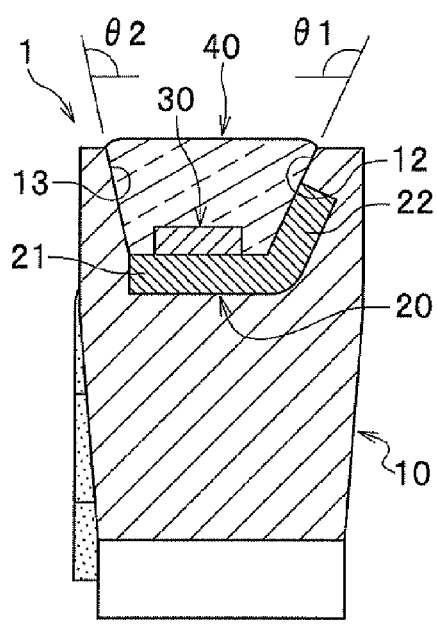
FIG. 2A is a cross-sectional view of a package of the light emitting device according to the present invention taken along a lateral direction (indicated by arrows in FIG. 3)

Also, as shown in FIGS. 3 and 2A, the first reflector 22A and the second reflector 22B are bent at the same inclined angle $\theta_1$ from the bottom plate portion 21 (the bottom face 11), and the inclined angle $\theta_1$ is greater than a inclined angle $\theta_2$ between the bottom plate portion 21 (the bottom face 11) and the side face 13. In this way, by varying the inclined angles $\theta_1$ and $\theta_2$ so that the inclined angle $\theta_1$ between the bottom plate portion 21 and the reflector 22 is greater than the inclined angle $\theta_2$ between the bottom plate portion 21 and the opposite side face 13, light emitted from the light emitting element 30 can be extracted efficiently as described later. In addition, compared to the case when the inclined angle $\theta_1$ is equal to the inclined angle $\theta_2$, for example, the extraction efficiency of light is improved when the difference between the inclined angle $\theta_1$ and the inclined angle $\theta_2$ is within a range of 5 to 50 degrees, and is further improved when the difference between the inclined angle $\theta_1$ and the inclined angle $\theta_2$ is within a range of 10 to 20 degrees. Also, the inclined angle $\theta_1$ is, for example, 115 degrees (112 to 118 degrees), and the inclined angle $\theta_2$ is, for example, 110 degrees (107 to 113 degrees).

Also, although a bending angle (the inclined angle) of the reflector 22 can be adjusted adequately, the reflector 22 is preferably formed at an angle to be directed toward the opening of the recess 9 formed in the package 10 so as to function as a reflector. Further, an end terminal of the reflector 22 is preferably embedded in the package 10. In this way, the peeling between the reflector 22 and the package 10 can be prevented. As shown in FIGS. 1 and 2, a central inclined plane 12a is integrally formed with the package 10 so that the end of the reflector 22 (the first reflector 22A and the second reflector 22B) is kept at the inner wall of the recess 9. For example, the central inclined plane 12a is formed by digging a metal mold when the lead frame 20 is insert molded.

Figure 4:
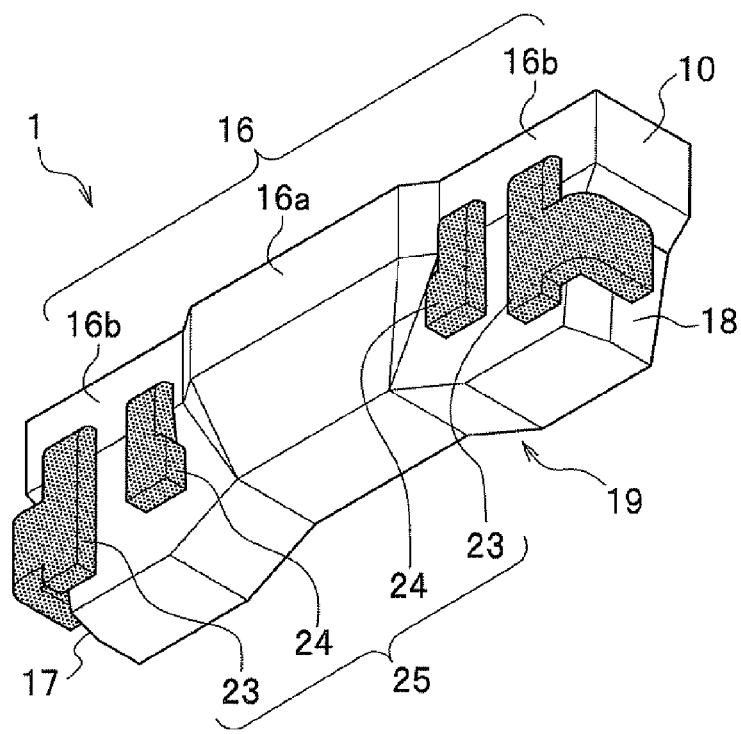
FIG. 4 is a perspective bottom view of the light emitting device according to the present invention.

Further, as shown in FIG. 4, the lead frame 20 has the projecting portion 25 which projects through the side face 13 of the package 10 outwardly and is bent so as to be placed on the bottom face of the package 10. Here, the projecting portion 25 means a portion which projects from the outer wall of the package 10 so as to be exposed, and includes portions placed on the bottom or top face of package 10. Here, the projecting portion 25 includes the terminal 23 and the bent portion 24 along the outer wall of the package 10. Also, the larger an area of the projecting portion 25, the more heat radiation. For example, the area of the projecting portion 25 is preferably 20% or more of an area of the lead frame 20 on which the light emitting element 30 is mounted. In this way, heat from the light emitting element 30 can be radiated efficiently.

In addition, if the size of the projecting portion 25 is enlarged and the projecting portion 25 is mounted on a face other than the rear face 19 of the package 10, the balance may be lost by weight of the projecting portion 25 at the time of mounting the light emitting device 1. For this reason, as shown in FIG. 1, by bending the projecting portion 25 and the reflector 22 in opposite direction each other, a center of gravity of the light emitting device 1 is prevented from being shifted extremely, and achieves the ease of mounting.

As shown in FIGS. 3 and 4, the projecting portion 25 preferably projects from the package 10 symmetrically. Further, a groove portion (not shown) may be provided at a portion at which the lead frame 20 projects from the package 10. By filling the groove portion with the resin of the package 10, adherence between the package 10 and the lead frame 20 may be improved. As shown in FIG. 3, the projecting portion 25 preferably has a symmetrical configuration, and preferably extends from an outside of the light emitting element 30 to the outer wall of the package 10. By forming the projecting portion 25 as described above, heat generated from the light emitting element 30 can be diffused symmetrically, and can be outwardly radiated efficiently.

Also, the projecting portion 25 projects from a position on the package, and the position thereof is preferably near a portion on which the light emitting element 30 is mounted. Here, the projecting portions 25 are placed at positions corresponding to lower portions 16b adjacent to a central bulging portion 16a formed by bulging a side outer wall of the package. According to the structure of the projecting portion 25, heat generated by the light emitting element 30 can be promptly radiated outwardly.

As shown in FIGS. 1 and 2, for example, the projecting portion 25 is substantially used to electrically connect the light emitting element 30 to the substrate 50 (see FIGS. 5A and 5B) at an installation position. That is, the lead frame 20 has the terminal 23 and the bent portion 24 as the projecting portion 25, and the terminal 23 is connected to an external power source. The terminals 23 branch off from the lead frame 20, and are bent along side outer walls 17 and 18 of the package 10.

Here, in addition, the projecting portion 25 may have only bent portion 24, and the bent portion 24 may be electrically connected to the substrate 50. However, as shown in FIGS. 3 and 4, aside from the bent portion 24, a pair of the terminals 23 may be bent along the bottom face 16 and the side outer walls 17 and 18 of the package 10. In this way, by bending the terminals 23 along the side outer walls 17 and 18, fillets can be formed on the side outer walls 17 and 18 when the light emitting device 1 is mounted by soldering. According to the above structure, the ease of mounting and good heat radiation can be achieved. Further, since the area of the lead frame 20 on which the light emitting element 30 is mounted is increased by an area of the terminal 23, heat radiation can be improved in the light emitting device 1. Also, according to the structure of the projecting portion 25, the compact light emitting device 1 (e.g., the side view type light emitting device 1) can increase the area of the lead frame 20 which contributes to heat radiation without increasing the size thereof.

As shown in FIGS. 1-4, the package 10 has the recess 9 having a rectangular opening on the front face, and is made by injection molding, etc. so that the bottom plate portion 21 of the lead frame 20 is exposed on the bottom face 11 of the recess 9. The package 10 is made of a thermoplastic resin (e.g., a liquid crystal polymer, a polyphthalamide resin, and a polybutylene terephthalate (PBT), etc.). In particular, since a semicrystalline polymer resin containing a high melting crystal such as a polyphthalamide resin has high surface energy, favorable adherence can be achieved between the package 10 and the sealing resin 40 filled in the recess 9 of the package 10. In this way, in a process during which the sealing resin 40 is filled to be cured, the peeling becomes hard to occur at the interface between the package 10 and the sealing resin 40 during a cooling process of the resin. Also, a molding material may contain a white pigment such as a titanium oxide.

As shown in FIG. 1, in the recess 9 of the package 10, the side face 12 and the side face 13 opposite to each other in the lateral direction, and the left side face 14 and the right side face 15 opposite to each other in the longitudinal direction are provided so that they are at predetermined angles with the bottom face 11. In addition, in the recess 9, inclined side faces are partitioned between the left side face 14 and the side faces 12, and the right side face 15 and the side faces 12 respectively, and the inclined side face is continuous with the side face 12 so that the opening of the recess 9 is chamfered.

As shown in FIGS. 2 and 3, the side face 12 of the recess 9 has a central inclined plane 12a which is provided at a central position in the longitudinal direction (Y-direction) corresponding to the installation position of the light emitting element 30 and is inclined at the predetermined angle, and side inclined planes 12b which are formed at both sides of the central inclined plane 12a. Also, the reflector 22 formed by bending one end of the lead frame 20 is exposed on the central inclined plane 12a of the side face 12 so as to be co-planar with the central inclined plane 12a. The central inclined plane 12a is formed in the longitudinal direction in a range where light directly emitted form the light emitting element 30 can be reflected, and extends to the opening of the recess 9 in a vertical direction along with the reflector 22.

Also, the reflector 22 is embedded in the side wall of the central inclined plane 12a so that the surface of the reflector 22 is co-planar with a resinous surface of the central inclined plane 12a. Further, a resinous surface of the package 10 is exposed on a central position of the central inclined plane 12a so as to be co-planar with the reflector 22. Here, although the central inclined plane 12a is formed at the central position of the side face 12, it may be formed over the side face 12.

Here, an inclined angle between the side inclined planes 12b formed at both sides of the central inclined plane 12a and the bottom face 11 is less than an inclined angle between the central inclined plane 12a and the bottom face 11. In addition, the inclined angle between the side inclined plane 12b and the bottom face 11 is less than an inclined angle between the opposite side face 13 and the bottom face 11.

Figure 2B:
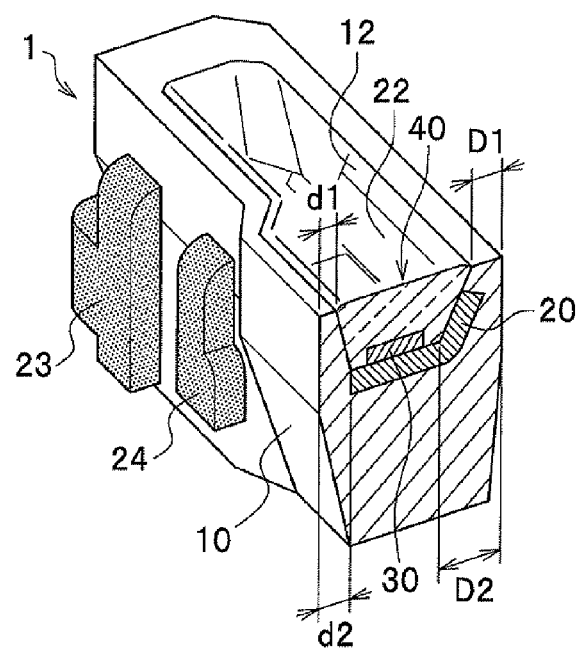
FIG. 2B is a cross-sectional perspective view of the package of the light emitting device according to the present invention taken along the lateral direction (indicated by arrows in FIG. 3)

Also, as shown in FIGS. 2A and 2B, around the recess 9, a thickness D1 of the side wall which is an end portion at the opening side of the central inclined plane 12a and the side inclined plane 12b is greater than a thickness d1 of the side wall which is an end portion at the opening of the side face 13. In addition, the thicknesses d1 and d2 of the upper and lower ends of the side wall of the side face 13 are less than the thicknesses D1 and D2 of the upper and lower ends of the side wall of the side face 12. In this way, since the thickness of the side wall of the side face 13 is less than the thickness of the side wall of the side face 12, a distance between the light emitting element 30 and the side face 13 can be made long, and the thickness of the package 10 can be made thinner while keeping high output.

Also, as shown in FIG. 3, a side wall of the side face 13 is provided with a central inclined plane 13a which is bulged outwardly at a central position in the longitudinal direction (in order to expand a width in the lateral direction) so that the bulging portion 16a is formed, and end inclined planes 13b adjacent to the central inclined plane 13a. As shown in FIG. 3, the central inclined plane 13a and the end inclined plane 13b are made of the resin which forms the package 10. In addition, here, the central inclined plane 13a and the end inclined plane 13b form the same inclined angle $\theta_2$ with the bottom face 11 (an inclined angle between the central inclined plane and the bottom face may differ from that between the end inclined plane and the bottom face). Also, here, a height of the bulging portion 16a which bulges outwardly from the central inclined plane 13a is the same as a thickness of the projecting portion 25 of the lead frame 20.

Accordingly, in the light emitting device 1, distances between the light emitting elements 30 and the side faces 12 and 13 which face the light emitting elements 30 respectively are set to values necessary to extract light. Also, distances between the light emitting elements 30 and the side faces 12 and 13 which do not face the light emitting elements 30 are made to be short so as to downsize the package. Also, as shown in FIG. 5B, for example, according to the structure of the projecting portion 25 and the central inclined plane 13a of the light emitting device 1, the light emitting device 1 can be connected to the substrate 50 in a balanced manner when the projecting portion 25 is connected to the substrate 50.

The light emitting element 30 is preferably a semiconductor light emitting element such as an LED, etc. The light emitting element 30 is preferably made by forming a semiconductor such as ZnS, SiC, GaN, GaP, InN, AlN, ZnSe, GaAsP, GaAlAs, InGaN, GaAlN, AlInGaP, AlInGaN, etc. as a light emitting layer on the substrate by liquid phase epitaxy, HVPE, or MOCVD. A wavelength of light from the light emitting element 30 can be chosen among a wavelength of an ultraviolet rays or an infrared rays, etc. by choosing a material of the semiconductor layer, or a mixture ratio. As the material of the light emitting layer, for example, $In_XAl_YGa_{1-X-Y}N$ ($0 \leq X \leq 1$, $0 \leq Y \leq 1$, $X+Y \leq 1$) can be used.

Also, the light emitting element 30 can be combined with various phosphors which are excited by the light from the light emitting element 30 and emit lights having wavelengths differ from that of the light from the light emitting element 30. As a material of the light emitting element 30 for emitting red light, a gallium aluminum arsenide semiconductor or an aluminum indium gallium phosphide semiconductor is preferably chosen. In addition, in order to make a color display, a red light LED chip having a wavelength of 610-700 nm, a green light LED chip having a wavelength of 495-565 nm, and a blue light LED chip having a wavelength of 430-490 nm are preferably combined.

Since two light emitting elements 30 are mounted on the lead frame 20 in this embodiment, two light emitting elements 30 which emit the same color light may be combined in order to enhance a luminous intensity. Also, for example, a plurality of light emitting elements 30 which emit different colors respectively corresponding to RGB may be combined in order to improve a color reproduction. When the plurality of light emitting elements 30 are mounted, all of the light emitting element 30 are preferably directed to the reflector 22.

In addition, if necessary, a wavelength converting member (not shown) may be placed around the light emitting element 30 in order to convert a wavelength of light emitted from the light emitting element 30 to a different wavelength. The wavelength converting member is formed by mixing a phosphor which is excited by the light from the light emitting element 30 and shows a fluorescence into, for example, a transparent resin (not shown) provided aside from the sealing resin 40. In this way, the wavelength of the light from the light emitting element 30 can be made long, and a mixed light composed of the light from the light emitting element 30 and a light having the longer wavelength obtained by the wavelength converting member can be extracted.

As shown in FIGS. 2A and 2B, the recess 9 is filled with the sealing resin 40 with the light emitting element 30 mounted on the lead frame 20 in the recess 9, the light emitting element 30 is protected against external force and moisture, etc., and a conductive member such as a wire (not shown) is protected. Also, the sealing resin 40 has light transparency so as to extract light from the light emitting element 30. Resinous materials used for the sealing resin 40 are weatherproof transparent resins such as an epoxy resin, a silicone resin, an acrylic resin, and an urea resin, etc. Especially, if the light transparent covering material contains moisture during process or storage, baking is performed on the transparent resin at 100 or more degrees centigrade for 14 or more hours in order to purge moisture contained in the resin. Accordingly, explosion caused by vapor and peeling between the light emitting element 30 and a mold member can be prevented.

Also, a filler, a scattering material, and a diffusion material, etc. may be dispersed in the sealing resin 40. Further, a wavelength converting layer in which a wavelength converting member such as phosphor is mixed may be provided. The diffusion material diffuses light so that a directivity of light from the light emitting element 30 is decreased and a viewing angle is increased. A fluorescent material converts the light from the light emitting element 30. That is, the fluorescent material converts the wavelength of light from the light emitting element 30 to an outside of the package 10. When the light from the emitting element 30 is a visible light having high energy and short wavelength, organic phosphors such as a beryline derivative, a ZnCdS:Cu, a YAG:Ce, and inorganic phosphors such as a nitrogenous $CaO$—$Al_2O_3$—$SiO_2$ activated by Eu and/or Cr, etc. are preferably used. When white light is obtained in the light emitting device 1, especially if a YAG:Ce phosphor is used, blue light from a blue light emitting element and yellow light which absorbs a part of the blue light so as to be a complementary color can be emitted depending on content of the YAG:Ce phosphor, and white light can be formed relatively easily and reliably. Similarly, when a nitrogenous $CaO$—$Al_2O_3PSiO_2$ phosphor activated by Eu and/or Cr is used, the blue light from the blue light emitting element and red light which absorbs a part of the blue light so as to be a complementary color can be emitted depending on content of the nitrogenous $CaO$—$Al_2O_3PSiO_2$ phosphor, and white light can be formed relatively easily and reliably. Also, the color heterogeneity can be reduced by settling the phosphor completely so as to remove bubbles.

<Manufacturing Process of Light Emitting Device>

Next, a manufacturing process of the light emitting device 1 is explained briefly.

First, the light emitting device 1 is prepared as a plate composed of a plurality of plane lead frames 20 connected each other. The plate has been already worked so as to remove unnecessary portions so that the reflector 22 and the projecting portion 25 are formed by bending the plate. Also, the plate is placed so that a cavity of the metal mold corresponds to each of the lead frames 20 respectively, and is injection molded so that components of the package 10 is provided on the lead frame 20. Further, after the plate is removed from the metal mold, the light emitting element 30 is mounted on a bottom plate portion 21 of the lead frame 20, wires, etc are electrically connected, and the recess 9 of the package 10 is filled with the sealing resin 40. After that, the lead frame 20 is cut into each light emitting device 1, and the terminal 23 and the bent portion 24 of the lead frame 20 are bent so as to complete each light emitting device 1. In addition, the reflector 22 is bent at a predetermined angle before the package 10 is injection molded. Also, the reflector 22 can be bent easily since a cut-off portion 21a is formed.

Figure 5A:
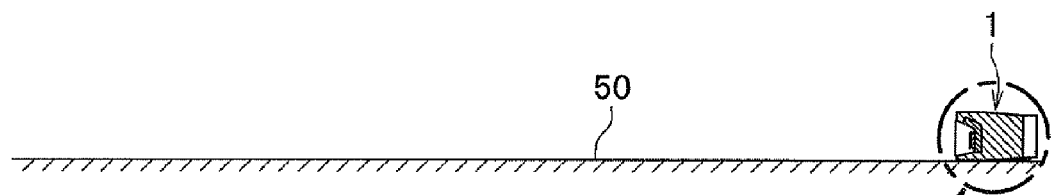
FIG. 5A is a cross-sectional view of the light emitting device according to the present invention mounted on a substrate.
Figure 5B:
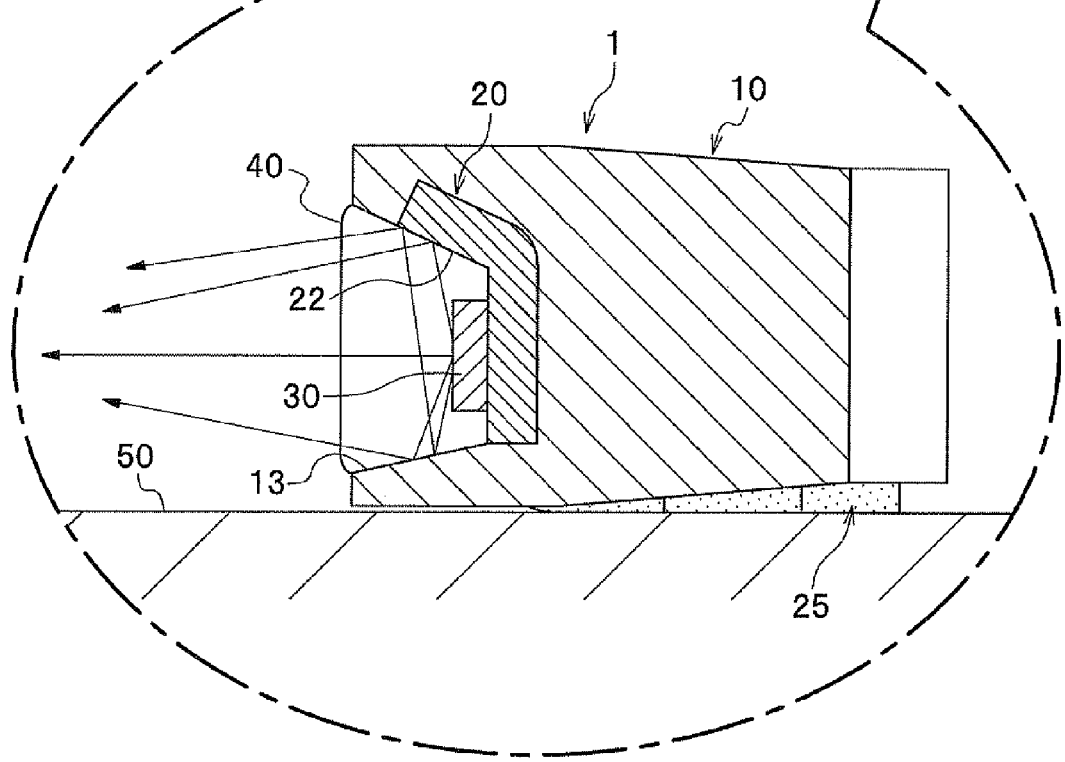
FIG. 5B is an enlarged cross-sectional view of the light emitting device of the present invention mounted on the substrate.

As shown in FIGS. 5A and 5B, for example, the light emitting device 1 is connected to the substrate 50. The light from the light emitting device 1 includes light which is emitted from the light emitting element 30 and passes through the sealing resin 40, and light which is reflected by the side face 13. Also, the light from the light emitting device 1 includes light which is emitted from the light emitting element 30 and is reflected by the side face 13 and the reflector 22, and light which is emitted from the light emitting element 30 and is reflected by the reflector 22. For this reason, in the light emitting device 1, more light is output without being reflected by the side face 13, and more light is extracted to be emitted compared to the case where the side faces 12 and 13 are inclined at the same angle.

Also, in the light emitting device 1, since the lead frame 20 on which the light emitting element 30 is mounted is integrally formed with the reflector 22 which prevents discoloration of the inner wall of the recess 9 formed in the package 10 and the projecting portion 25 which radiates heat generated by the light emitting element 30 to the outside of the package 10, heat radiation of the light emitting device 1 can be improved. In this way, when the large lead frame 20 is formed in the recess 9 and a contact area between the sealing resin 40 and the lead frame 20 is increased, deterioration and discoloration of the sealing resin 40 can be prevented and reliability of the light emitting device 1 can be improved.

In addition, each component of the present invention may deformed. For example, with reference to FIGS. 6A-6C and 7, light emitting devices 1A-1C having different configurations will be explained. In addition, the same reference numbers are used for similar members, and detailed explanations will be omitted.

Figure 6A:
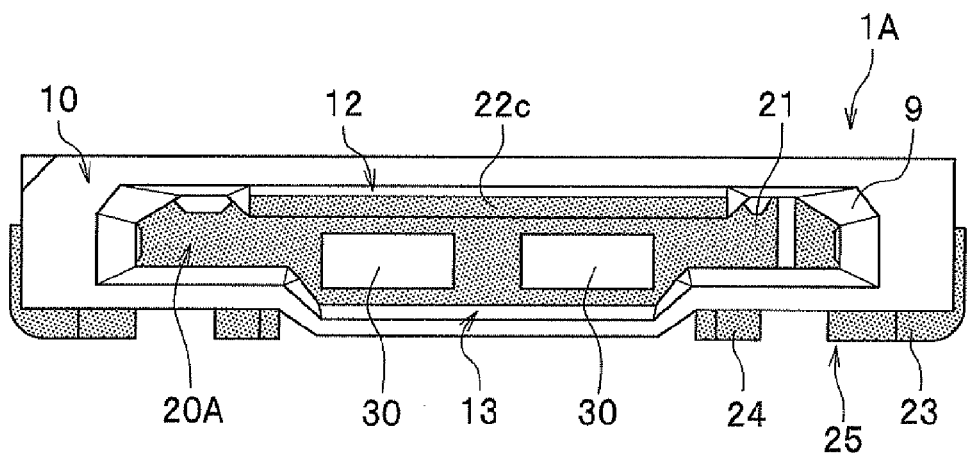
FIG. 6A is a front view showing other configuration of a light emitting device according to the present invention.

As shown in FIG. 6A, a light emitting device 1A may be provided with a lead frame 20A having no cut-off portion 21a. Accordingly, a reflector 22c which is bent at a predetermined inclined angle with the bottom plate portion 21 continues from one end to the other end in the longitudinal direction. In this way, since the reflector 22c is formed to continue, the configuration is simplified compared to the case where two or more reflectors 22c are provided.

Figure 6B:
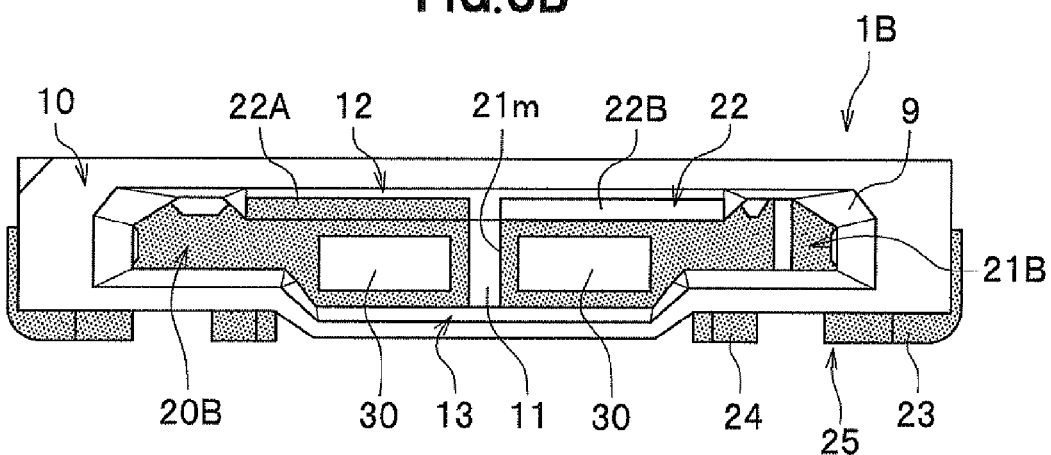
FIG. 6B is a front view showing other configuration of a light emitting device according to the present invention.

Also, as shown in FIG. 6B, instead of the cut-off portion 21a, a light emitting device 1B may have a notch 21m which extends from the reflector 22 to a raised portion of the side face 13 so that a lead frame 20B is separated at its center. In this way, since the notch 21m is provided so that the bottom plate portion 21B is separated from the reflector 22, a contact area between the bottom face 11 and the sealing resin 40 (see FIGS. 2A and 2B) is increased so that the adherence is increased.

Figure 6C:
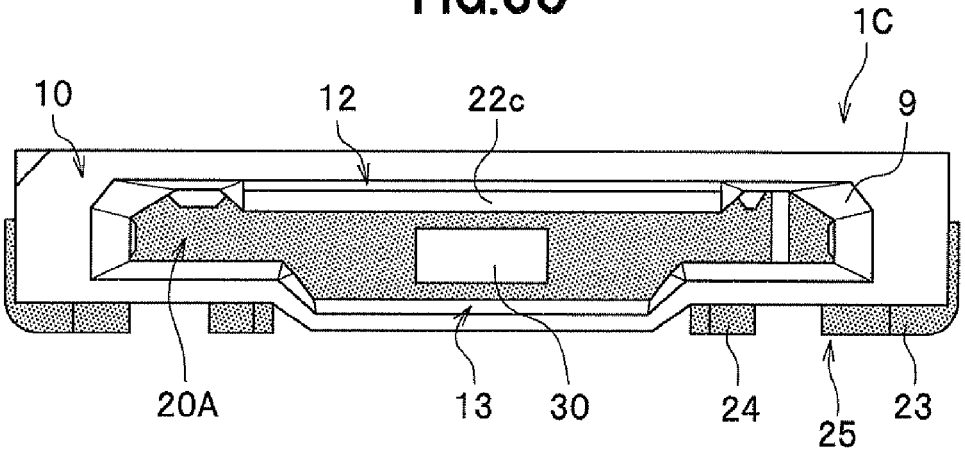
FIG. 6C is a front view showing other configuration of a light emitting device according to the present invention.

Further, as shown in FIG. 6C, a light emitting device 1C may have only one light emitting element 30.

Figure 7:
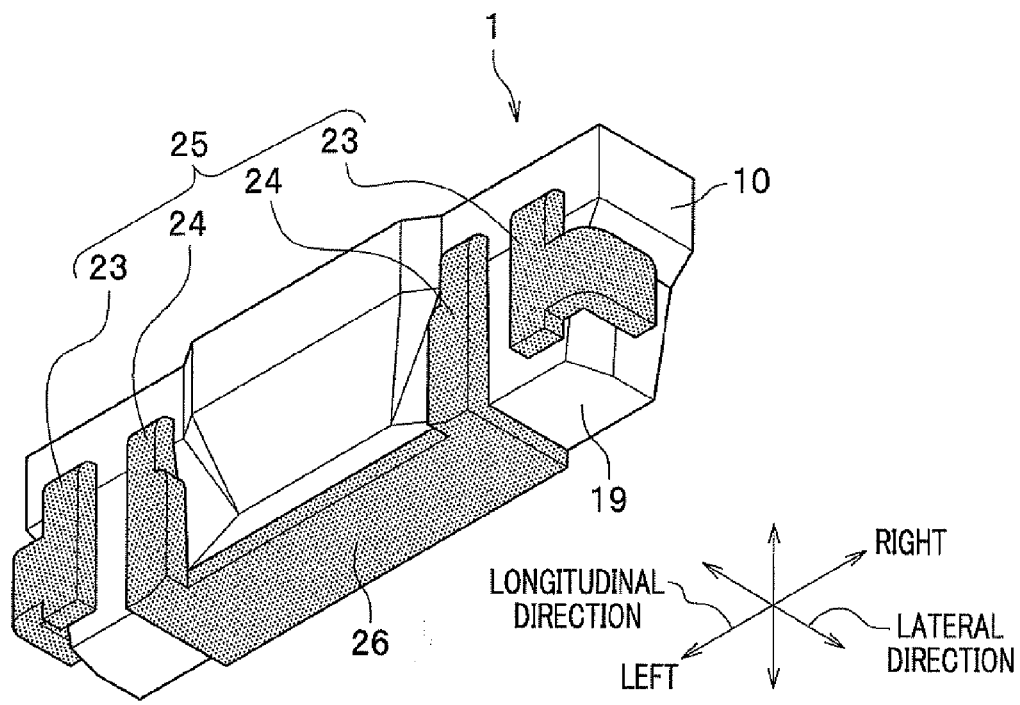
FIG. 7 is a perspective view showing other configuration of a projecting portion of a light emitting device according to the present invention.

Also, as shown in FIG. 7, the light emitting device 1 (1A-1C) may be provided with a back face bent portion 26 formed at the end of the bent portion 24 along the rear face 19 of the package 10. Here, this back face bent portion 26 has a plate configuration, connects both ends of the bent portion 24 each other, and faces the rear face 19 of the package 10. In addition, the rear face 19 of the package 10 is concaved at its center in the longitudinal direction. However, since the plate configured back face bent portion 26 is partially separated from the rear face 19, heat radiation can be improved. In this way, the back face bent portion 26 of the light emitting device 1 (1A-1C) improves heat radiation.

Figure 8:
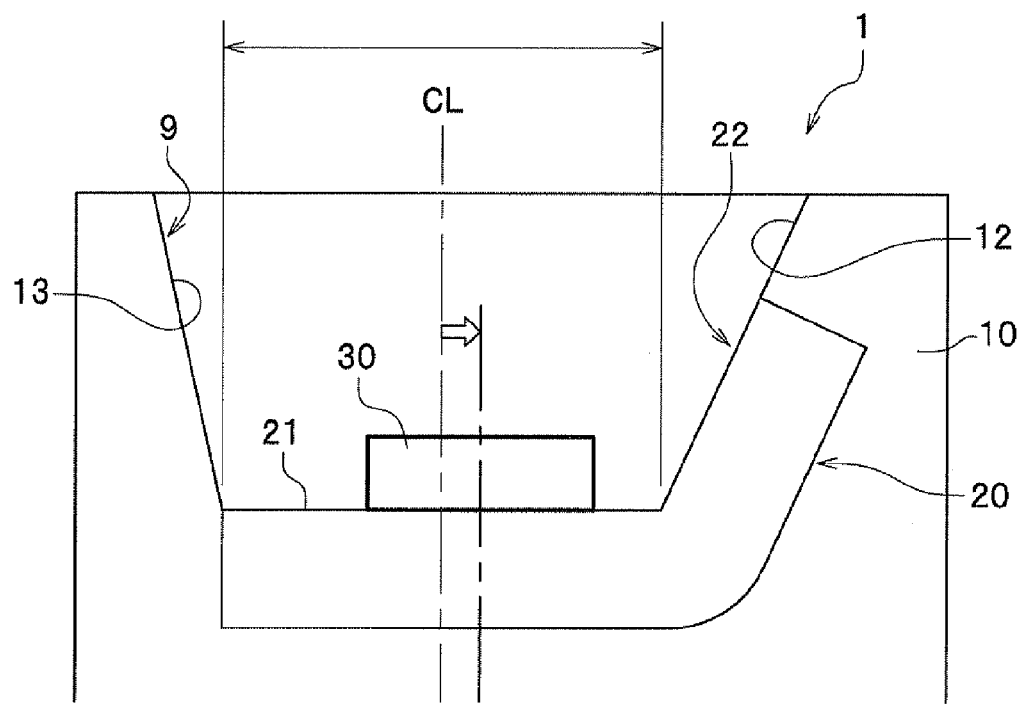
FIG. 8 is a schematic diagram showing an installation position of other configuration in a light emitting element of a light emitting device according to the present invention.

Also, as shown in FIG. 8, in the light emitting device 1 (1A-1C), the light emitting element 30 may be shifted from a center line CL toward the reflector 22 between the side faces 12 and 13. In this way, by shifting the light emitting element 30 toward the reflector 22, a distance between the light emitting element 30 and the side face 13 is increased, an effect of light upon the resinous package 10 is reduced, and a deterioration of the resinous package 10 can be prevented.

Also, the configurations of the light emitting devices 1, and 1A-1C are not limited to the above configurations, and various changes and modifications may be made. As one example, an opening (not shown) may be provided at a center of the back face bent portion 26 which connects both ends of the bent portion 24 (see FIG. 7) so that a resin filling port (a gate: not shown) which is used from the rear face 19 of the package 10 when the package 10 is injection molded is prevented from contacting the back face bent portion 26.

Also, as another example, in the light emitting devices 1 and 1A-1C, an area of the back face bent portion 26 may be made as large as possible along the rear face 19 of the package 10.

In addition, three lead frames 20 (not shown), i.e., a central lead frame 20 on which the light emitting element 30 is mounted, and right and left lead frames 20 having the projecting portions 25 which are electrically connected to external devices may be provided so that the light emitting element 30 is connected to the right and left lead frames 20 via wires (not shown). In this way, for example, since adjacent lead frames 20 have the same polarity, short circuit can be prevented if the adjacent lead frames 20 are electrically connected each other owing to migration, etc.

Also, a convex portion (not shown) may be formed between the terminal 23 and the bent portion 24 on the outer bottom face 16 of the package 10 (see FIG. 4). By the convex portion, short circuit can be prevented when adjacent lead frames 20 having different polarities are mounted.

Also, by applying a reflection coating on the reflector 22, light from the light emitting element 30 can be reflected efficiently, and light can be extracted efficiently. In addition, the reflector 22 may be formed at the lead frame 20 on which the light emitting element 30 is mounted, and a reflector (not shown) which is integrally formed with the lead frame 20 may be provided along the left side face 14 and the right side face 15 in order to prevent discoloration of the package 10.

Also, the reflector 22 is formed so as to cover the package inner wall from light emitted from the light emitting element 30, and a width and a height of the reflector 22 can be adjusted adequately depending on a size, etc. of the recess 9 of the package 10.

Also, the package 10 has right and left lower portions 16b which are provided along the outer wall so as to store the projecting portion 25. As shown in FIG. 4, stepped portions may be formed on the side outer walls 17 and 18 so that the outer walls 17 and 18 are divided into two pieces in a direction from the opening to the rear face 19 and lower portions are provided. In other words, in the light emitting devices 1 and 1A-1C, if the projecting portion 25 projects outwardly over the outer wall of the package 10, the projecting portion 25 may be bent by external force applied during mounting process, etc. of the light emitting devices 1 and 1A-1C. Accordingly, the lower portion is formed so that the projecting portion 25 is approximately co-planar with the outer wall of the package 10 in order to prevent the projecting portion 25 from being bent or deformed by the external force.

Also, in the light emitting devices 1 and 1A-1C, although the central inclined plane 13a and the end inclined plane 13b are inclined at the same inclined angle $\theta_2$, the central inclined plane 13a and the end inclined plane 13b may be inclined at different angles respectively. When they are inclined at different angles, for example, an angle between the central inclined plane 13a and the bottom face 11 is less than an angle between the end inclined plane 13b and the bottom face 11. In this way, the thickness of the side wall corresponding to the bent portion 24 is increased in order to improve strength.

While the present invention has been described with reference to preferred embodiments such as the light emitting devices 1 and 1A-1C, it is clearly understood that the present invention is not limited thereto. Accordingly, the present invention should be limited only by the appended claims.

The light emitting device according to the present invention can be applied to various light sources such as a light source for illumination, a light source for an indicator, a light source for a vehicle, a light source for a display, a light source for a backlight of a liquid crystal display, a signaler, a part for a vehicle, a channel letter for a signboard, etc.

What is claimed is:

1. A light emitting device, comprising:
a package which is formed of a resin and has a recess which is provided with a bottom face and two pairs of opposite inner walls surrounding the bottom face;
the package having two pairs of opposite side walls made of the inner walls and corresponding outer walls;
a sealing resin provided in the recess for sealing a light emitting element;
a lead frame exposed from the package so as to contact the sealing resin at the bottom face;
and wherein the light emitting element is provided on the lead frame, wherein
the lead frame has a bottom plate portion and a reflector portion exposed from the package wherein the reflector portion contacts the sealing resin along only one wall of the pair of opposite inner walls, and a first angle between the reflector portion and the bottom face is greater than a second angle between the other wall opposite to the reflector portion and the bottom face.

2. The light emitting device according to claim 1, wherein a thickness of the resin of the package from an inner wall to its corresponding outer wall is such that a thickness of one wall of a pair of the opposite side walls is greater than the thickness of another wall of the pair of the opposite side walls.

3. The light emitting device according to claim 1, wherein the light emitting element is placed at a portion closer to the reflector portion than to a center of the bottom face between one of the pairs of the opposite side walls comprising the pair of opposite inner walls.

4. The light emitting device according to claim 1, wherein a plurality of the light emitting elements are placed spaced apart from each other in a longitudinal direction of the bottom face.

5. The light emitting device according to claim 4, wherein a plurality of reflector portions are placed spaced apart from each other corresponding to the plurality of light emitting elements, and the one of the pair of opposite inner walls of the resin of the package is exposed to the sealing resin between adjacent ones of the plurality of reflector portions.

6. The light emitting device according to claim 5, wherein the bottom plate portion of the lead frame has a cut-off portion exposing, to the sealing resin, a part of the bottom face of the resin of the package at corresponding positions between adjacent ones of the plurality of reflectors portions.

7. The light emitting device according to claim 5, wherein the bottom plate portion of the lead frame has a groove separating the bottom plate portion of the lead frame at corresponding positions between adjacent ones of the plurality of reflectors portions.

8. The light emitting device according to claim 1, wherein the lead frame has a projecting portion which is extended outwardly from the package side wall, wherein the side wall comprises the another wall of the pair of the opposite inner walls, and is bent along corresponding outer wall of the package.

9. The light emitting device according to claim 8, wherein the recess of the package comprises an opening wider in a longitudinal direction, the package has a width at a central position in the longitudinal direction of the opening greater than a width at least two opposite sides of the central position, the light emitting element is placed on the lead frame at a position corresponding to the central portion, and the projecting portion is formed along the outer wall at both the at least two opposite sides of the central position.

10. The light emitting device according to claim 8, wherein the projecting portion comprises two terminal portions respectively bent along the outer walls of the package, and comprises two bent portions adjacent to respective terminal portions and respectively bent along the outer walls of the package.

11. The light emitting device according to claim 10, wherein the bent portions comprise respective end portions and are connected by a back face bent portion formed along a back face of the package at respective end portions.

12. The light emitting device according to claim 2, wherein the lead frame has a projecting portion which is extended outwardly from the package through a side wall, wherein the side wall comprises the another wall of the pair of opposite inner walls, and the projecting portion is bent along corresponding outer wall of the package.

13. The light emitting device according to claim 3, wherein the lead frame has a projecting portion which is extended outwardly from the package through a side wall, wherein the side wall comprises the another wall of the pair of opposite inner walls, and the projecting portion is bent along corresponding outer wall of the package.

14. The light emitting device according to claim 5, wherein the lead frame has a projecting portion which is extended outwardly from the package through a side wall, wherein the side wall comprises the another wall of the pair of opposite inner walls, and the projecting portion is bent along corresponding outer wall of the package.

15. The light emitting device according to claim 12, wherein the recess of the package comprises an opening wider in the longitudinal direction, the package has a width at a central position in the longitudinal direction of the opening greater than a width at least two opposite sides of the central position, the light emitting element is placed on the lead frame at a position corresponding to the central portion, and the projecting portion is formed along the outer wall at the at least two opposite sides of the central position.

16. The light emitting device according to claim 13, wherein the recess of the package comprises an opening wider in a longitudinal direction, the package has a width at a central position in the longitudinal direction of the opening greater than a width at least two opposite sides of the central position, the light emitting element is placed on the lead frame at a position corresponding to the central portion, and the projecting portion is formed along the outer wall at the at least two opposite sides of the central position.

17. The light emitting device according to claim 14, wherein the recess of the package comprises an opening wider in the longitudinal direction, the package has a width at a central position in the longitudinal direction of the opening greater than a width at lease two opposite sides of the central position, the light emitting element is placed on the lead frame at a position corresponding to the central portion, and the projecting portion is formed along the outer wall at the at least two opposite sides of the central position.

18. A light emitting device, comprising:
   a package which is formed of a resin and has a recess which is provided with a bottom face and two pairs of opposite inner walls surrounding the bottom face; the package having two pairs of opposite side walls made of the inner walls and corresponding outer walls;
   a light emitting element;
   a sealing resin provided in the recess for sealing the light emitting element;
   and a lead frame exposed from the package so as to contact the sealing resin at the bottom face,
   wherein the light emitting element is provided on the lead frame, and wherein
   the lead frame has a bottom plate portion and a reflector portion exposed from the package wherein the reflector portion contacts the sealing resin along only one wall of the pair of opposite inner walls, and a first angle between the reflector portion and the bottom face is greater than a second angle between the other wall opposite to the reflector portion and the bottom face,
   wherein thickness of the resin of the package from an inner wall to its corresponding outer wall is such that a thickness of one wall of a pair of the opposite side walls is greater than a thickness of another wall of the pair of the opposite side walls,
   wherein the light emitting element is placed at a portion closer to the reflector portion than to a center of the bottom face between a pair of the opposite side walls comprising the pair of opposite inner walls,
   and wherein a plurality of the light emitting elements are placed spaced apart from each other in a longitudinal direction of the bottom face.

19. The light emitting device according to claim 18, wherein the lead frame has a projecting portion which is extended outwardly from the package through a side wall, wherein the side wall comprises the another wall of the pair of opposite inner walls, and the projecting portion is bent along corresponding outer wall of the package.

20. The light emitting device according to claim 18, wherein the recess of the package comprises an opening wider in the longitudinal direction, the package has a width at a central position in the longitudinal direction of the opening greater than a width at least two opposite sides of the central position, the light emitting element is placed on the lead frame at a position corresponding to the central portion, and the projecting portion is formed along the outer wall at the at least two opposite side of the central position.

* * * * *